United States Patent
Westwood

(10) Patent No.: US 12,004,288 B2
(45) Date of Patent: Jun. 4, 2024

(54) RESONANT-COUPLED TRANSMISSION LINE

(71) Applicant: Teradyne, Inc., North Reading, MA (US)

(72) Inventor: Andrew Westwood, North Reading, MA (US)

(73) Assignee: TERADYNE, INC., North Reading, MA (US)

( * ) Notice: Subject to any disclaimer, the term of this patent is extended or adjusted under 35 U.S.C. 154(b) by 322 days.

(21) Appl. No.: 17/184,793

(22) Filed: Feb. 25, 2021

(65) Prior Publication Data

US 2022/0272834 A1 Aug. 25, 2022

(51) Int. Cl.
*G01R 31/00* (2006.01)
*G01R 1/04* (2006.01)
(Continued)

(52) U.S. Cl.
CPC ......... *H05K 1/0222* (2013.01); *G01R 1/0433* (2013.01); *G01R 1/0466* (2013.01); *G01R 1/0483* (2013.01); *G01R 31/2886* (2013.01); *H01P 3/08* (2013.01); *H05K 1/0251* (2013.01); *H01L 2924/00* (2013.01); *H01L 2924/00014* (2013.01); *H01L 2924/14* (2013.01); *H05K 2201/09609* (2013.01); *H05K 2201/09754* (2013.01); *H05K 2201/09809* (2013.01)

(58) Field of Classification Search
CPC ............... H05K 1/0222; H05K 1/0251; H05K 2201/09609; H05K 2201/09754; H05K 2201/09809; H05K 2201/09618; G01R 31/2886; G01R 31/2889; G01R 1/0483; G01R 1/0466; G01R 1/0433; H01P 3/08; H01P 3/003; H01P 5/028; H01L 2924/00; H01L 2924/00014; H01L 2924/14
USPC ......... 324/71, 378, 403, 415, 425, 500, 537, 324/756.01, 756.02
See application file for complete search history.

(56) References Cited

U.S. PATENT DOCUMENTS

2001/0017549 A1  8/2001  Inoue et al.
2005/0122115 A1  6/2005  Maguire et al.
(Continued)

FOREIGN PATENT DOCUMENTS

JP  2020-072122 A  5/2020

OTHER PUBLICATIONS

Chew, W.C., "Impedance Matching on a Transmission Line," ECE 350 Lecture Notes (6 pages).
(Continued)

*Primary Examiner* — Raul J Rios Russo
(74) *Attorney, Agent, or Firm* — Burns & Levinson LLP

(57) ABSTRACT

An example printed circuit board (PCB) includes a substrate having layers of a dielectric material, where the layers of dielectric material include a first layer and a second layer; a conductive trace that is between the first layer and the second layer and that is parallel to the first layer and the second layer along at least part of a length of the conductive trace; and a conductive via that extends at least part-way through the layers of dielectric material and that connects electrically to the conductive trace, where the conductive via is configured also to connect electrically to a signal input to receive or to transmit a signal that has a center frequency span.

38 Claims, 13 Drawing Sheets

(51) Int. Cl.
*G01R 31/28* (2006.01)
*H01P 3/08* (2006.01)
*H05K 1/02* (2006.01)

(56) References Cited

U.S. PATENT DOCUMENTS

| | | | |
|---|---|---|---|
| 2005/0190614 A1* | 9/2005 | Brunette | H05K 1/0222 365/192 |
| 2006/0125573 A1* | 6/2006 | Brunette | H05K 1/0251 333/33 |
| 2009/0224786 A1 | 9/2009 | Wu et al. | |
| 2011/0121849 A1 | 5/2011 | Roland et al. | |
| 2012/0182093 A1* | 7/2012 | Vickes | H05K 1/0222 333/204 |
| 2014/0085856 A1* | 3/2014 | Shirao | H01P 3/003 174/254 |
| 2015/0097633 A1* | 4/2015 | DeVries | H01P 1/042 333/33 |

OTHER PUBLICATIONS

Impedance Matching, Transmission Line Impedance, Chapter 25 (18 pages).
Impedance Matching, 13.1 Conjugate and Reflectionless Matching (25 pages).
Lecture 15: Impedance Matching using Transmission Line, Module 2: Transmission Line (6 pages).
Quarter-Wave Impedance Transformer in Impedance Matching Applications, Cadence System Analysis (8 pages). https://resources.system-analysis.cadence.com/blog/msa2021-quarter-wave-impedance-transformer-in-impedance-matching-applications.
3.19: Quarter-Wavelength Transmission Line, Engineering Libre Texts, Dec. 23, 2021 (4 pages). https://eng.libretexts.org/Bookshelves/Electrical_Engineering/Electro-Optics/Book%3A_Electromagnetics_I_(Ellington)/03%_Transmission_Lines/3.
Written Opinion for International application No. PCT/US2022/017519, dated Jun. 13, 2022, (5 pages).
International Search Report for International application No. PCT/US2022/017519, dated Jun. 13, 2022, (3 pages).
International Preliminary Report on Patentability in Application No. PCT/US2022/017519, dated Sep. 7, 2023, 7 pages.
"The 50 Ω Question: Impedance Matching in RF Design", [online] Retrieved from the Internet <URL:https://www.allaboutcircuits.com/textbook/radio-frequency-analysis-design/real-life-rf-signals/the-50-question-impedance-matching-in-rf-design/>, [retrieved on Jan. 22, 2024], 8 pages.

* cited by examiner

RESONANT-COUPLED TRANSMISSION LINE

TECHNICAL FIELD

This specification describes examples of a transmission line that includes a resonant-coupled conductor.

BACKGROUND

Test systems are configured to test the operation of electronic devices referred to as devices under test (DUTs). A test system may include test instruments to send signals, including digital and analog signals, to a DUT for testing. An example device interface board (DIB) includes a structure to route the signals to the DUTs and to route signals from the DUTs back towards the test instruments.

SUMMARY

An example printed circuit board (PCB) includes a substrate having layers of a dielectric material, where the layers of dielectric material include a first layer and a second layer; a conductive trace that is between the first layer and the second layer and that is parallel to the first layer and the second layer along at least part of a length of the conductive trace; and a conductive via that extends at least part-way through the layers of dielectric material and that connects electrically to the conductive trace, where the conductive via is configured also to connect electrically to a signal input to receive a signal that has a center frequency span. The example PCB also includes a first ground layer that connects electrically to the conductive via, where the first ground layer connects to a reference ground voltage, where the first ground layer is adjacent to the second layer, and where the first ground layer is located a distance from the conductive trace that is substantially equal to one quarter (¼) of a wavelength of the center frequency span of the signal. A second ground layer is adjacent to the first layer and also connects to the reference ground voltage. The conductive trace is between the first ground layer and the second ground layer. The example PCB may also include one or more of the following features, alone or in combination.

The first ground layer may reflect at least the center frequency span of the signal along the conductive via and a resulting reflected signal launches into the conductive trace. The conductive trace, the conductive via, the first ground layer, and the second ground layer may form a first transmission line. The first transmission line may be interleaved with other transmission lines on different layers of the PCB. The first transmission may be in a same layer of the substrate as one or more other transmission lines in the PCB. Conductive traces may be between respective layers of dielectric material in the substrate and may be at least partly parallel to the respective layers of dielectric material. Conductive vias may extend at least part-way through the layers of dielectric material and may connect electrically to respective conductive traces. The conductive vias may be configured also to connect electrically to respective signal inputs to receive respective signals that have center frequency spans.

The signal inputs may include a radio frequency signal, a microwave signal, or a millimeter wave signal. The signal inputs may include a sinusoidal signal, a modulated signal, or a bidirectional signal that moves bidirectionally through the conductive trace. The bidirectional signals moving through the conductive trace may be separated by a difference of frequency and share a common overall bandwidth.

Third ground layers may electrically connect to respective ones of the conductive vias connected electrically to respective signal inputs. Each third ground layer may connect to the reference ground voltage. Each third ground layer may be located a distance from a respective conductive trace that is substantially equal to one quarter (¼) of a wavelength of a center frequency span of a signal received at a respective signal input. The first ground layer, the second ground layer, and the third ground layers may be unbroken. The first ground layer, the second ground layer, and the third ground layers may be electrically connected to a common reference ground voltage.

A structure having a configuration of the conductive trace, the conductive via, the first ground layer, and the second ground layer may be repeated in the substrate along a same dimension of the PCB. The same dimension may be horizontal, e.g., in the same layer. Structures having a configuration of the conductive trace, the conductive via, the first ground layer, and the second ground layer may be stacked in the substrate along a dimension orthogonal to the layers of dielectric material.

The signal input may include an input transmission line. The signal input may include or a coaxial connector configured to connect directly to the conductive via. The signal input may also configured to source signals for output from the PCB. The PCB may be or include a device interface board (DIB) configured to hold devices under test (DUTs) for testing. The signal input may electrically connect to a signal path between the DIB and a test instrument configured to generate the signal or to receive the signal.

The first layer of the substrate may include one or more dielectric layers and the second layer of the substrate may include one or more dielectric layers. The first layer and the second layer may be asymmetric in that the first layer and the second layer may have different thicknesses. A thickness of the second layer may be substantially equal to one quarter (¼) of a wavelength of the center frequency span of the signal.

The example PCB may include ground vias that are conductive and that partly encircle the conductive via connected to the signal input. The ground vias may connect electrically to the first ground layer. Ground vias may be absent at a point of electrical connection between the conductive trace and the conductive via. The example PCB may include a conductor configured to create an electrical connection between the conductive trace and the conductive via. The conductor may be configured to match an impedance of the conductive trace to an impedance of the conductive via. The conductor may be between the first layer and the second layer and may be parallel to the first layer and the second layer along at least part of a length of the conductor. The conductive trace may include a stripline conductor. The conductor may have a width that differs from a width of the conductive trace.

The example PCB may include ground vias that are conductive and that run substantially parallel to the conductive trace along at least part of a length of the conductive trace. The ground vias may connect electrically to the first ground layer.

The first layer and the second layer of the PCB may be or include different dielectrics. The different dielectrics may have at least one of different dispersion characteristics or different insertion losses. The different dielectrics may have different chemical properties such that, from a perspective of the signal, the first layer and the second layer have a same electromagnetic thickness even though the first and second layer have different physical thicknesses.

An example system includes a device interface board configured to hold devices under test (DUTs) for testing, a test instrument configured to output signals to test the DUTs, where the DIB is for routing the signals to the DUTS; and a control system configured to control operation of the test instrument to output the signals to test the DUT. The DIB may include a substrate having layers of a dielectric material, where the layers of dielectric material include a first layer and a second layer; a conductive trace that is between the first layer and the second layer and that is parallel to the first layer and the second layer along at least part of a length of the conductive trace; and a conductive via that extends at least part-way through the layers of dielectric material and that connects electrically to the conductive trace, where the conductive via is configured also to connect electrically to a signal input to receive a signal that has a center frequency span. The example PCB also includes a first ground layer that connects electrically to the conductive via, where the first ground layer connects to a reference ground voltage, where the first ground layer is adjacent to the second layer, and where the first ground layer is located a distance from the conductive trace that is substantially equal to one quarter (¼) of a wavelength of the center frequency span of the signal. A second ground layer is adjacent to the first layer and also connects to the reference ground voltage. The conductive trace is between the first ground layer and the second ground layer. The example system may also include one or more of the following features, alone or in combination.

The first layer of the substrate may include one or more dielectric layers and the second layer of the substrate may include one or more dielectric layers. The first layer and the second layer may be asymmetric in that the first layer and the second layer may have different thicknesses. A thickness of the second layer may be substantially equal to one quarter (¼) of a wavelength of the center frequency span of the signal.

The DIB may include ground vias that are conductive and that encircle the conductive via partly. The ground vias may connect electrically to the first ground layer. The DIB may include a conductor configured to create an electrical connection between the conductive trace and the conductive via. The conductor may be configured to match an impedance of the conductive trace to an impedance of the conductive via.

A structure having a configuration of the conductive trace, the conductive via, the first ground layer, and the second ground layer may be repeated in the substrate. Structures having a configuration of the conductive trace, the conductive via, the first ground layer, and the second ground layer may be stacked in the substrate along a dimension orthogonal to the layers of dielectric material.

An example DIB is configured to act as a mechanical and electrical interface between a DUT and a test instrument of a test system. The DIB includes a substrate that includes layers a dielectric material, where the layers of dielectric material include a first layer and a second layer; a conductive trace that is between the first layer and the second layer and that is parallel to the first layer and the second layer along at least part of a length of the conductive trace; and a conductive via that extends through the layers of dielectric material and that connects electrically to the conductive trace, where the conductive via is configured also to connect electrically to a signal input to receive a signal having a center frequency span. The DIB also includes means for causing the signal to reflect along the conductive via, for inhibiting dissipation of at least part of the signal into the substrate, and for inhibiting signal reflection along the conductive trace.

Any two or more of the features described in this specification, including in this summary section, may be combined to form implementations not specifically described in this specification.

At least part of the systems and apparatus described herein may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the systems and apparatus described herein, or portions thereof, may be implemented as an apparatus, method, or a test system that may include one or more processing devices and computer memory to store executable instructions to implement control of the stated functions. The apparatus, systems, and/or components thereof described herein may be configured, for example, through design, construction, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Described herein are examples of printed circuit boards (PCBs) such as a device interface board (DIB) having transmission lines formed therein. An example transmission line includes a resonant-coupled conductor configured to transmit time-varying signals having a center frequency span. Examples of signals that may be transmitted over the transmission line include, but are not limited to, microwave signals, radio frequency (RF) signals, and millimeter wave (mmwave) signals. The signals may be sinusoidal, modulated, unidirectional, or bidirectional as described below.

Figure 1:
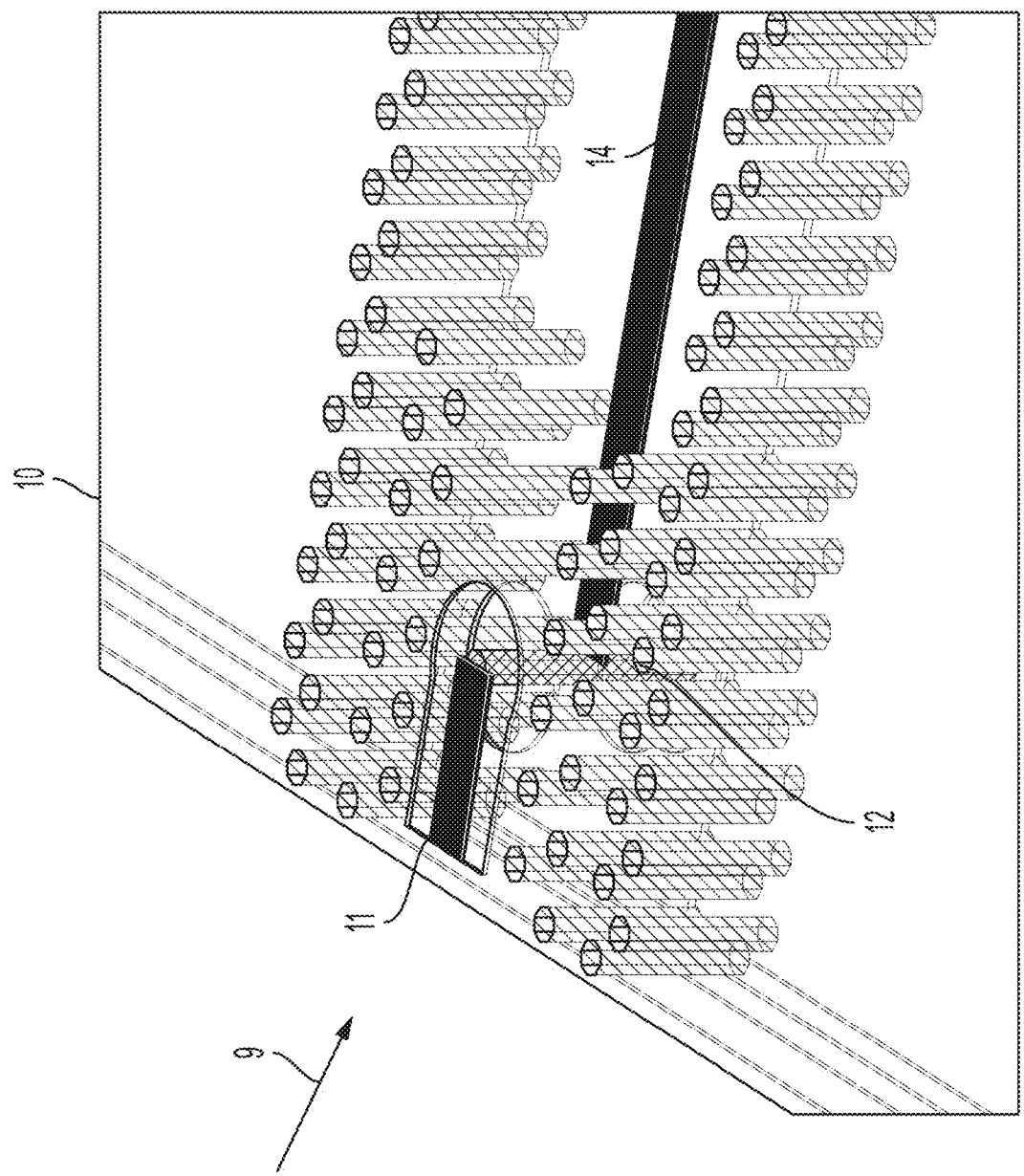
FIG. 1 is a downwardly-facing partially transparent perspective view of components of an example transmission line formed on a device interface board (DIB).
Figure 2:
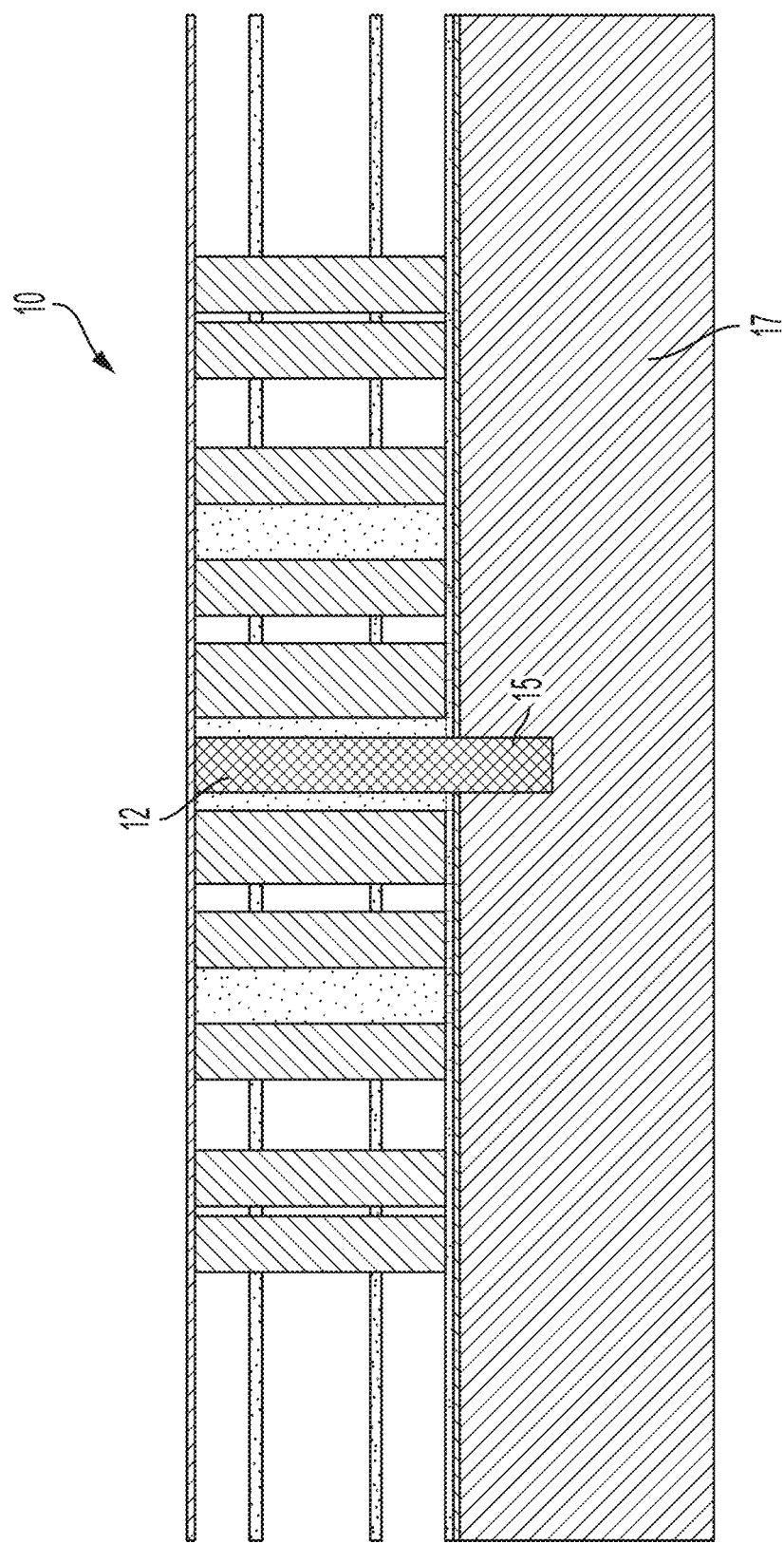
FIG. 2 is a front view of the components of the example transmission line of FIG. 1.
Figure 3:
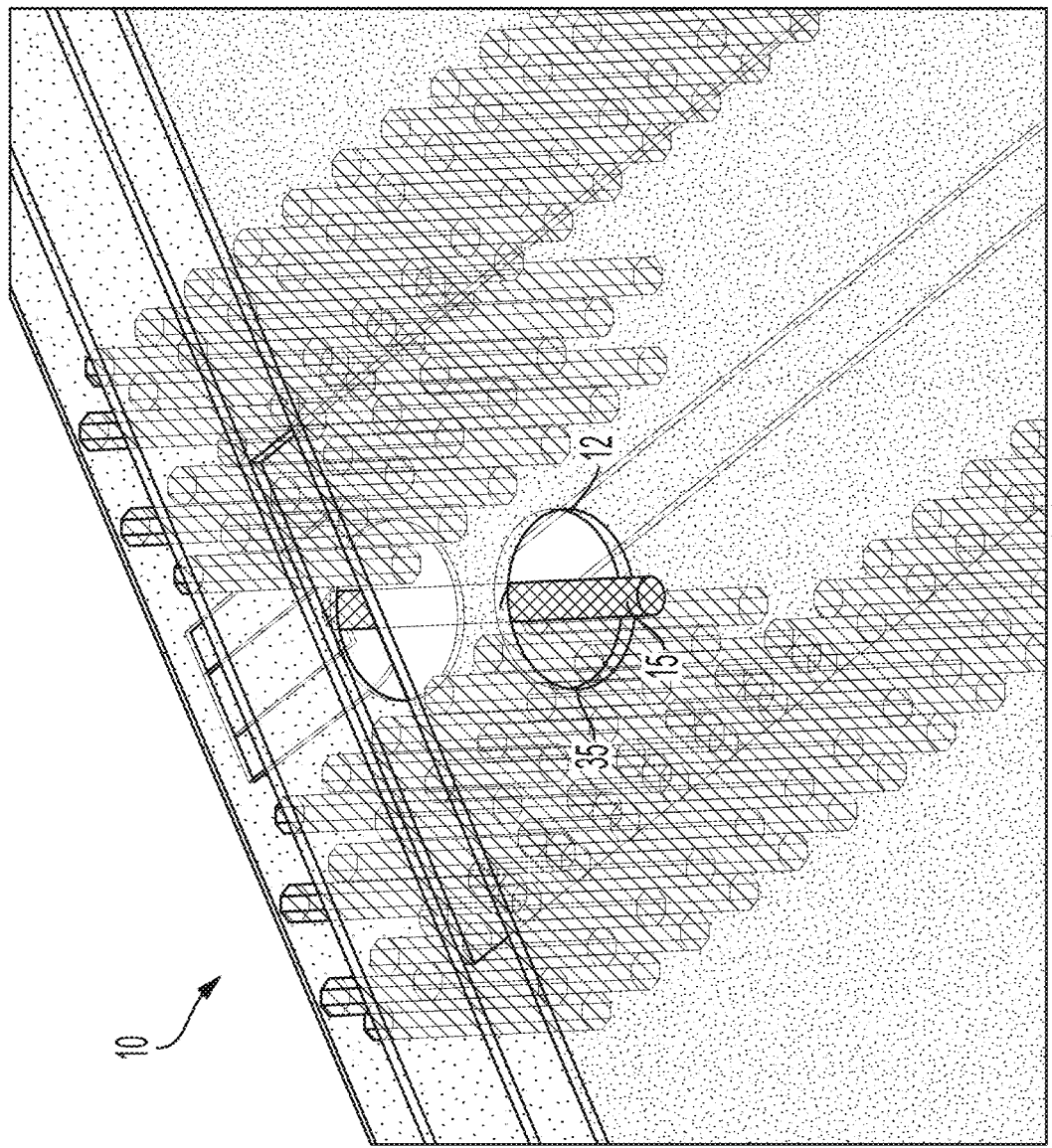
FIG. 3 is an upwardly-facing partially transparent perspective view of the components of the example transmission line of FIG. 1.

In some examples, a PCB such as a DIB is formed by aggregating layers of substrate and conductive material. The substrate may include, for example, one or more different types of dielectric material, as described below. The conductive material forms conductive traces and conductive vias through the substrate. Some types of DIBs may have sub-optimal performance when transmitting high frequency signals. For example, FIGS. 1 to 3 shown components of example transmission line structure formed in a DIB 10. In this regard, FIG. 2 shows a front view of the components shown in FIG. 1 looking in the direction of arrow 9 and FIG. 3 shows an underside perspective view. In DIB 10, a signal is received via planar-shaped signal input 11. A columnar conductive via 12 carries the signal to a stripline conductor 14, which is a type of conductive trace. As shown in FIGS. 2 and 3, conductive via 12 includes a drill-through component 15 (or just "drill-through") that protrudes into an underlying substrate 17 (FIG. 2). Drill-through 15 is an artifact of the construction of DIB 10 and, according to some circuit board manufacturers, cannot be eliminated from the structure.

Figure 4:
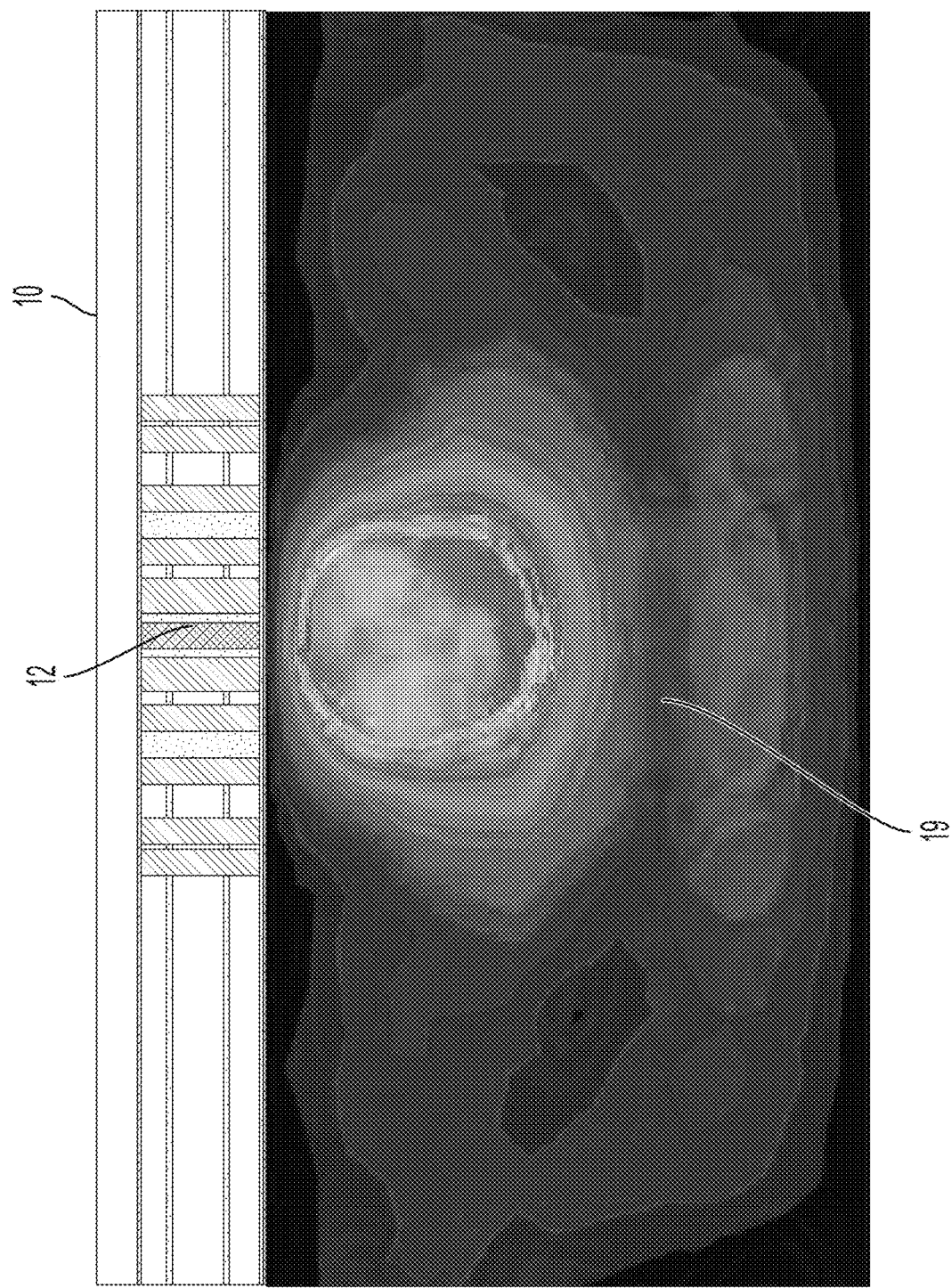
FIG. 4 is a front view of the components of the example transmission line of FIG. 1 showing energy dissipation therefrom.
Figure 5:
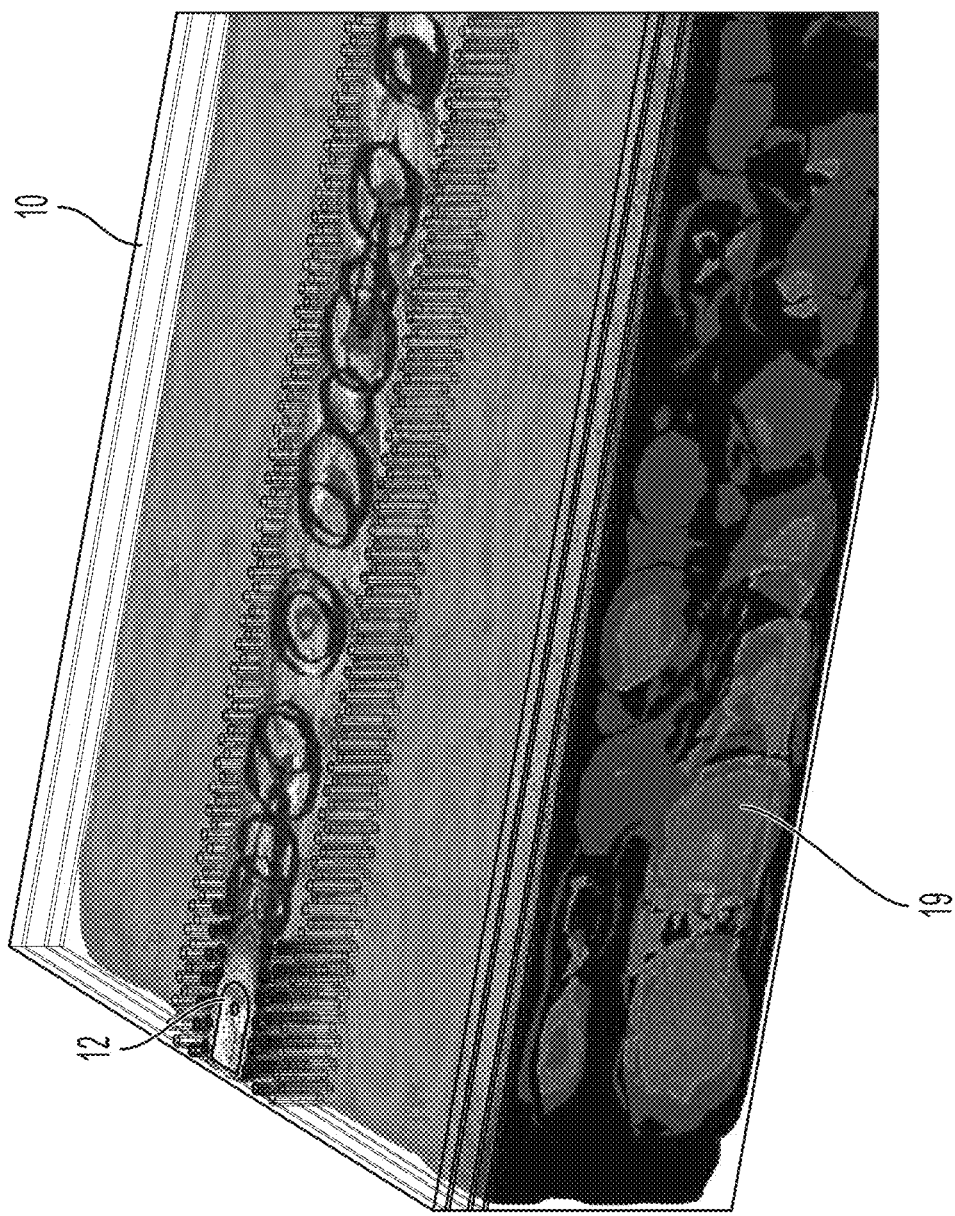
FIG. 5 is a downwardly-facing partially transparent perspective view of the components of the example transmission line of FIG. 1 showing energy dissipation therefrom.

Drill-through 15 can adversely affect signal transmission, particularly at high frequencies including, but not limited to, mmwave frequencies. For example, in some cases, part of an input signal may not launch into stripline conductor 14 as intended, but rather may propagate down conductive via 12 and to drill-through 15. In this instance, as shown in FIG. 4, drill-though 15 functions as an antenna by dissipating energy 19 (represented by greyscale shading) from the signal into the surrounding substrate and into nearby transmission lines (not shown 4). FIG. 5 shows another view of energy dissipation 19 (again shown in greyscale shading) of the type described with respect to FIG. 4. Energy dissipation of the type shown in FIGS. 4 and 5 can result in signal insertion loss and crosstalk in nearby conductive traces. In some cases, crosstalk can affect transmission lines that are within, for example, 100 mils (2.54 millimeters) of each other. Typically, however, transmission lines are much closer than that in a DIB.

In addition, as shown in FIG. 1, although planar input 11, conductive via 12, and stripline conductor 14 define an electrical pathway through which electrical signals can be transmitted and received, the columnar shape of conductive via 12 produces impedance discontinuities at points of contact to planar input 11 and stripline conductor 14. These impedance discontinuities may contribute to reflections of signals along the stripline conductor. The reflections of the signals may also contribute to signal insertion loss experienced by the transmission line.

Implementations of the PCB-implemented transmission lines described herein may address—for example, reduce or eliminate—crosstalk, signal insertion loss, and/or signal reflections of the type described previously. An example PCB, such as a DIB having one or more transmission lines, includes a substrate comprised of layers of a dielectric material, including asymmetric first and second layers. A conductive trace, such as a stripline conductor, is between the first and second layers and is parallel to the first and second layers along at least part of the length of the conductive trace. A center conductive via, which may have a columnar shape, extends at least part-way through the first and second layers of dielectric material and connects electrically to the conductive trace. The conductive via is configured also to connect electrically to a signal input to receive a time-varying signal having a center frequency span, such as a microwave signal, an RF signal, or an mmwave signal. A first ground layer connects electrically to the conductive via. The first ground layer connects to and defines a reference ground voltage and is adjacent to the second layer. The first ground layer may be a distance from the conductive trace that is substantially equal to one quarter (¼) of a wavelength of the center frequency span of the signal. In this context, substantially equal may include, but is not limited to, lengths that are within ±5% or less of the quarter wavelength of the center frequency span of the signal. This configuration results in the stripline conductor being resonantly-coupled. A second ground layer is adjacent to the first layer and is connected to the reference ground voltage such that the conductive trace and the first and second layer of substrate are between the first ground layer and the second ground layer. The foregoing configuration is part of a shielded transmission line for transmitting signals received on the PCB from an external source and for transmitting signals from the PCB to an external destination.

In this regard, the first ground layer connected to the conductive via is configured to cause the part of the RF signal that propagates down the conductive via and not into the stripline conductor to reflect back towards the stripline conductor and then to launch into the stripline conductor. Because the first ground layer is a distance from the conductive trace that is substantially equal to one quarter of a wavelength of the center frequency span of the signal, the center frequency span—which may include a center frequency of the signal and a band around the center frequency—will not experience significant interference on the stripline conductor. In this regard, by shorting the conductive via at one-quarter wavelength of the desired operating center frequency, the drill-through appears to be an infinite impedance at the point of connection to the stripline conductor, thereby preventing the loss of signal energy or distortion of impedance at that connection point. Also, while the signal proceeding into the drill-through is shifted first 90° in-transit to the drill-through, and another 90° returning to the intersection of the strip transmission line, the signal experiences a time-delay of one-half period at the operating center-frequency. During that time-delay, a signal arriving from the input also experiences a one-half period advance, or a progression of 180°. Time continues for both signals arriving at the intersection, source and reflection. Therefore when the drill-through-reflected signal reflected from the ground plane arrives at the stripline conductor intersection 180° shifted, the input signal arriving at the same intersection has also shifted 180°, thereby causing constructive interference, as both are now in-phase and of the same voltage at any given instant.

Reflection off of the ground layer may also reduce signal energy dissipation into the surrounding substrate, which may reduce crosstalk in nearby transmission lines. The signal reflection back into the stripline conductor also may reduce signal insertion loss and signal reflection along the stripline conductor. To address signal reflection further, a conductor is configured to create an electrical connection between the stripline conductor and the conductive via in order to match an impedance of the conductive trace to an impedance of the conductive via. In this regard, in some implementations, the impedance of the stripline conductor (a conductive trace) is 50Ω; however, conductive traces having any appropriate impedance may be used.

Figure 6:
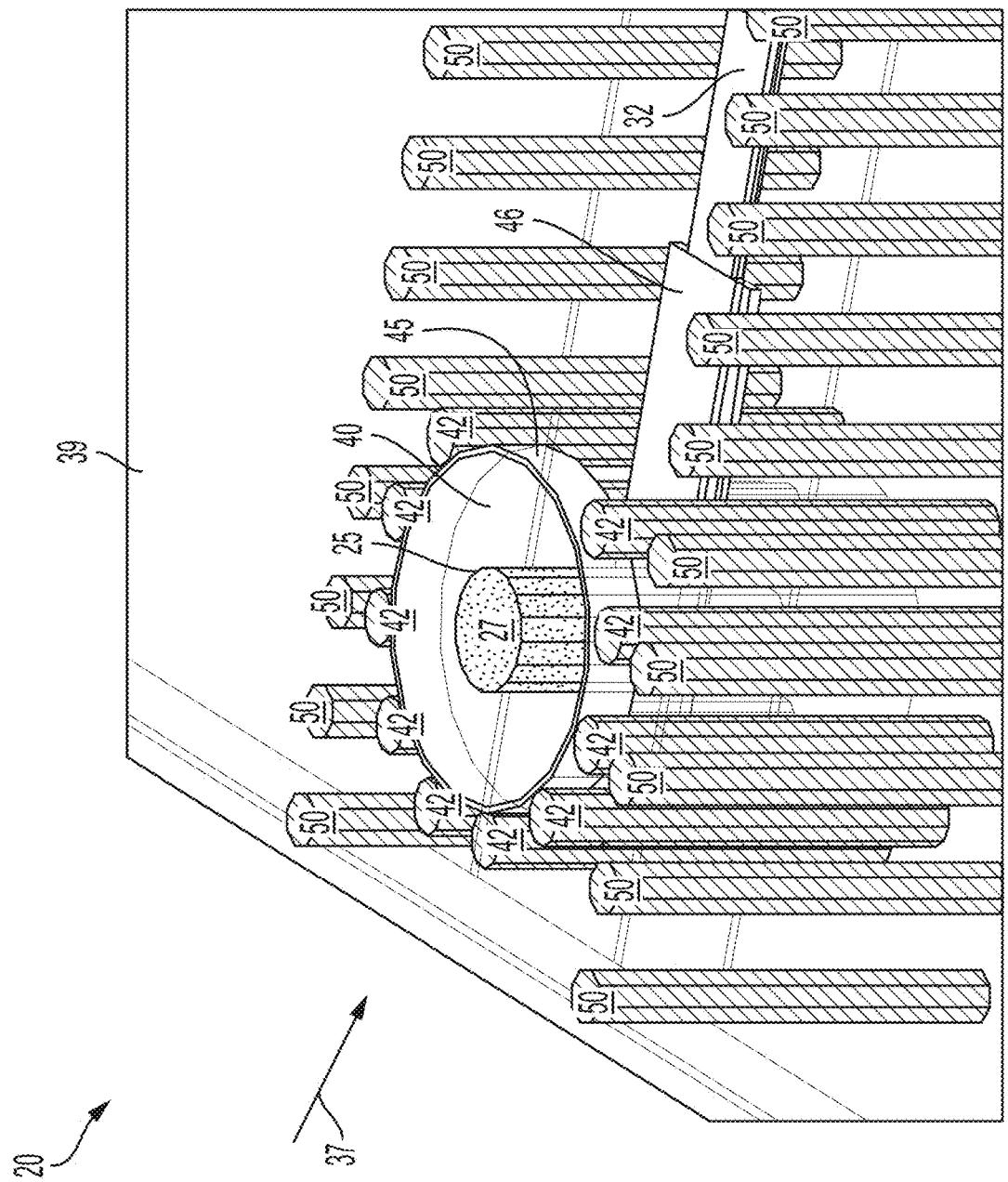
FIG. 6 is a downwardly-facing partially transparent perspective view of components of an example transmission line formed on a DIB.
Figure 7:
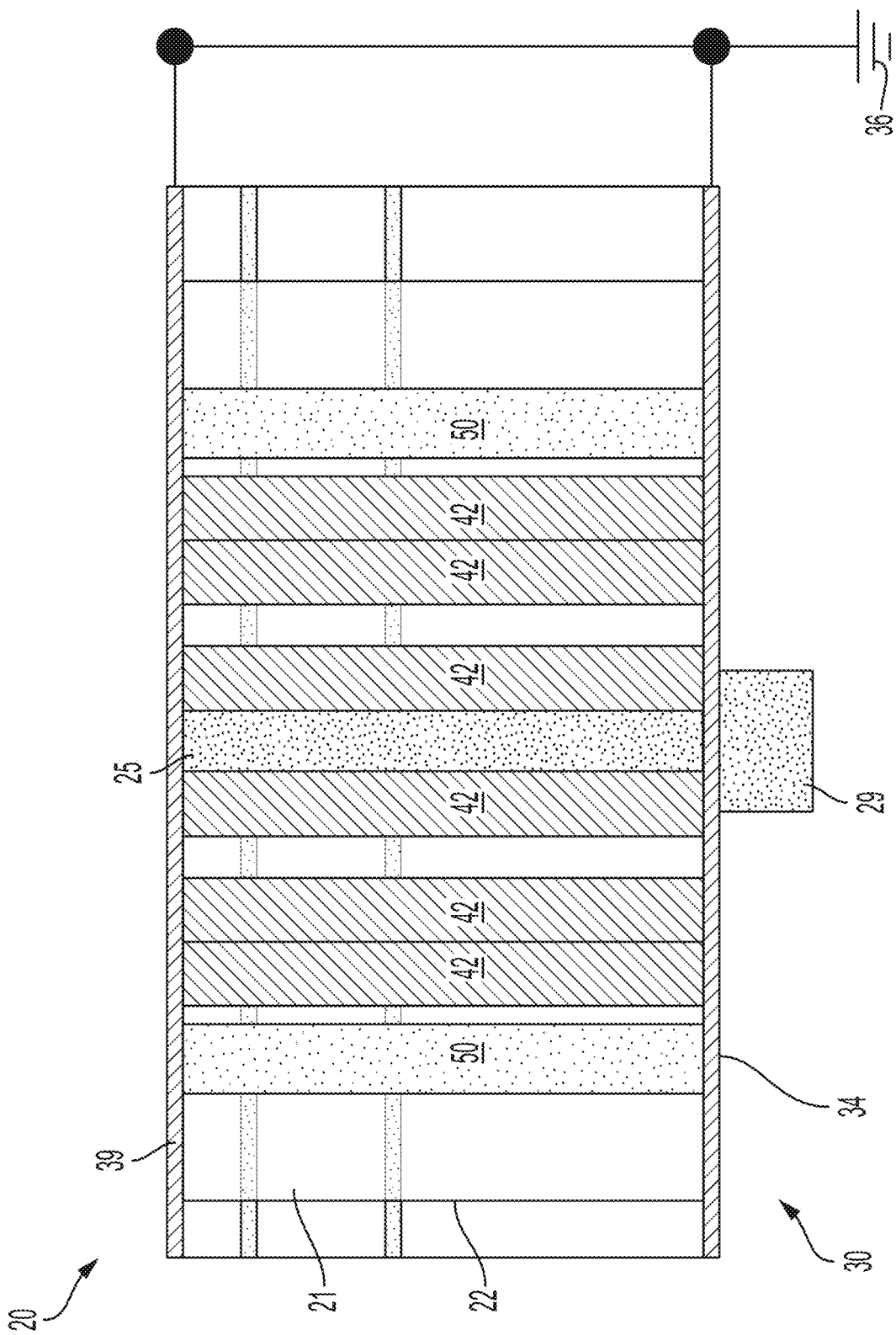
FIG. 7 is a front view of the components of the example transmission line of FIG. 6.
Figure 8:
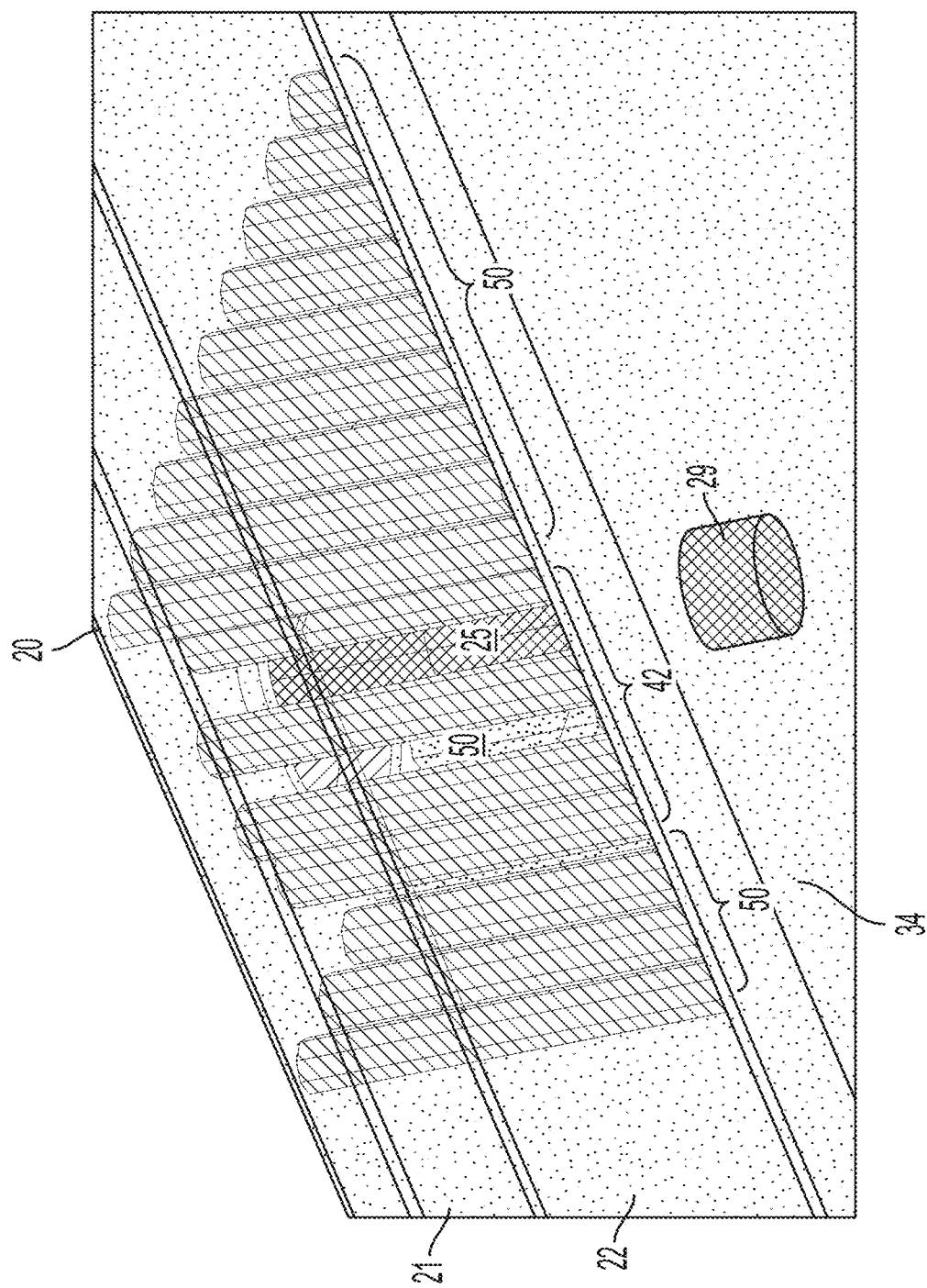
FIG. 8 is an upwardly-facing perspective view of the components of the example transmission line of FIG. 6.

FIGS. 6 to 8 shows example components included in a PCB, such as a DIB 20, that may be part of a transmission line over which signals pass through the DIB. In this regard, FIG. 7 shows a front view of the components shown in FIG. 6 looking in the direction of arrow 37 and FIG. 8 shows an underside perspective view. As shown in FIGS. 6 to 8, DIB 20 is made of multiple layers 21 and 22, each of which may include multiple layers of substrate (for example, dielectric material) and conductive material among the substrate to form conductive traces and vias through the substrate. For example, in some cases tens, hundreds, or thousands of such layer may be stacked fused to form the DIB. Conductive traces may be formed in the interior of the DIB surrounded by substrate or on a surface of the DIB. In some implementations, the substrate includes epoxy, resin, polytetrafluoroethylene (PTFE), or a combination thereof; however, any appropriate dielectric material may be used as the substrate. In some examples, the dielectric materials include epoxy that binds powder together along with fiberglass fibers. In some examples, as described below, the dielectric materials include the Megtron 6® and Megtron 7® dielectrics from Panasonic® Corporation.

As shown in FIGS. 6 to 8, DIB 20 includes a center via 25. In this example, center via 25 is columnar, conductive, and connectable directly or indirectly to a signal input such as a planar transmission line (not shown) or a coaxial cable connector (not shown). The signal input transports a signal having a center frequency span to the DIB. The center frequency span may be of primary concern in applications such as device testing, since wireless devices may be configured to operate within a frequency band around the center frequency. In an example, an RF device may be configured to operate at a center frequency of 44 gigahertz (GHz) and a 1 decibel (dB) insertion loss 3 GHz band around 44 GHz. As noted, In some examples, the signal provided by the signal input includes, but are not limited to, microwave signals, RF signals, and mmwave signals.

In an example definition, a microwave signal has a frequency range of about 1 GHz to about 30 GHz. In an example definition, an RF signal has a frequency range of about 20 kilohertz (KHz) to about 3 GHz. In an example definition, a mmwave signal has a frequency range of about 30 GHz to about 300 GHz. However, the definitions of microwave, RF, and mmwave may change over time and in different jurisdictions. As such, signals labeled herein as microwave, RF, or mmwave are not limited to the preceding numerical frequency ranges.

The signal input that carries the signal having the center frequency span may be along, and part of, a signal path between the DIB and a test instrument configured to generate the signal, a variant of the signal, or a signal on which the signal is based. Center via 25 is configured to receive this signal and to transport this signal through substrate in DIB 20 to a conductive trace located internally among the substrate layers included in DIB 20. To this end, center via 25 extends at least part-way—for example, all the way or not all the way—through layers 21 and 22 of substrate. In DIB 20, center via 25 extends all the way through layers 23 and 24. As shown in FIG. 6, an end 27 of center via 25 is exposed to enable direct connection to an input transmission line or to a coaxial cable connector. In some implementations, connection to the signal input and the center via may include intermediary electrically-conductive structures.

As shown in FIGS. 7 and 8, center via 25 also includes a drill-through 29 that protrudes into an underlying substrate 30 (FIG. 7). As explained above, drill-through 29 is an artifact of the construction of DIB 20. Center via 25 and drill-through 29 may be made of any appropriate conductive material including, but not limited to, copper.

As shown in FIGS. 7 and 8, DIB 20 includes at least two layers 21 and 22 having dielectric material. In some applications, DIB 20 include many more than two layers. In this example, the layers include a first layer 21 comprised of dielectric material and a second layer 22 comprised of dielectric material. First layer 21 and second layer 22 may also include conductive material deposited into etchings or cut-outs of the substrate to form the electrically-conductive components described herein. The conductive material is a fraction of the thickness of the dielectric material and is sandwiched between all or most dielectric materials in the layers.

First layer 21 may include one or more dielectric layers and second layer 22 may include one or more dielectric layers. The first layer and the second layer are asymmetric in this case, since the first layer and the second layer have different thicknesses. In some implementations, however, the first layer and the second layer may have the same thickness and, therefore, may be symmetric. For reasons explained herein, the thickness of the second layer is substantially equal to one quarter of a wavelength of the center frequency span of a signal through the DIB. In this regard, substantially equal to one quarter the wavelength of the center frequency span of the signal may include, but is not limited to, deviations of ±10% from a length of one quarter the wavelength of the center frequency span, deviations of ±9% from the length of one quarter the wavelength of the center frequency span, deviations of ±8% from the length of one quarter the wavelength of the center frequency span, deviations of ±7% from the length of one quarter the wavelength of the center frequency span, deviations of ±6% from the length of one quarter the wavelength of the center frequency span, deviations of ±5% from the length of one quarter the wavelength of the center frequency span, deviations of ±4% from the length of one quarter the wavelength of the center frequency span, deviations of ±3% from the length of one quarter the wavelength of the center frequency span, deviations of ±2% from the length of one quarter the wavelength of the center frequency span, or deviations of ±1%) from the length of one quarter the wavelength of the center frequency span. In FIGS. 6 and 7, center via 25 extends to the end of second layer 22 and its drill-through 29 protrudes beyond second layer 22 into an underlying substrate 30 (FIG. 7) as was the case with respect to FIGS. 2 and 3.

As explained previously, first layer 21 and second layer 22 of substrate may include the same type of dielectric material or different types of dielectric material. In an example, the different dielectric materials may have different chemical properties such that, from an electromagnetic perspective, first layer 21 and second layer 22 appear to have the same physical thickness even though the first and second layer have different physical thicknesses. The different chemical properties may cause the different dielectrics to have different signal dispersion characteristics, different signal insertion losses, or both different signal dispersion characteristics and different signal insertion losses. In an example, first layer 21 includes one or more layers comprised of the dielectric Megtron 6® dielectrics from Panasonic® Corporation. In an example, second layer 22 includes one or more layers comprised of the dielectric Megtron 7® dielectrics from Panasonic® Corporation. Among other things, Megtron 6® and Megtron 7® are hard enough to withstand pressures needed for connection to the signal input without deforming or without deforming significantly. Other types of dielectrics may be used in DIB 20 in place of, or in addition to, Megtron 6® and Megtron 7®.

Referring to FIG. 6, DIB 20 also includes one or more conductive traces, such as stripline conductor 32. An example stripline conductor includes a planar strip of metal such as copper formed on or in a layer of the substrate. A width of the strip, a thickness of the surrounding substrate, and a relative permittivity of the substrate affect the characteristic impedance of the stripline conductor. In this example, stripline conductor 32 is between at least parts of first layer 21 and second layer 22 and is parallel to the first layer and the second layer along at least part of its length. The stripline conductor is a part of the transmission line formed within DIB 20 that is configured to transport signals between center via 25 and one or more DUTs on the DIB. Accordingly, the length of the stripline conductor may vary and is based on the distance between center via 26 and a DUT. As noted above, signals may move in one direction through stripline conductor 32 or bidirectionally. For example, signals may move from center via 25 through stripline conductor 32 to DUTs on the DIB. This is referred to as receiving signals at DIB. For example, signals may move from a DUT on the DIB through stripline conductor 32 to center via 25. This is referred to as sourcing signals for output from the DIB. Signals may move bidirectionally and concurrently through stripline conductor 32, e.g., signals may move from center via 25 to the DUTs at the same time as signals move from the DUTs to center via 25. Concurrently-transmitted bidirectional signals may include two signals that are separated by a difference of frequency—for example, they have different frequencies—but that share a common overall bandwidth.

As shown in FIGS. 7 and 8, DIB 20 includes a first ground layer 34, which may be made of any appropriate conductive material, such as copper. Ground layer 34 connects electrically to center via 25 and defines a reference ground voltage for the DIB. That is, ground layer 34 may be connected electrically to a reference voltage 36 that comprises a common ground voltage for all transmission line ground layers in the DIB. In this example, ground layer 34 is adjacent to—for example, plated onto—the bottom of the second layer 22 from which drill-through 29 protrudes. And, because the thickness of second layer 22 is substantially equal to one quarter of a wavelength of the center frequency span of the time-varying signal input to the DIB through the signal input described above, the ground layer is also located a distance from stripline conductor 32 that is substantially equal to one quarter of the wavelength of the center frequency span of that signal. Drill-through 29 of center via 25 is electrically connected to—in other words, electrically shorted to—ground layer 34, as shown most clearly in FIG. 8. This is in contrast to the configuration of FIG. 3, in which a hole 35 prevents electrical connection between an electrical ground and drill-through 15. The configuration of DIB 20 shown in FIGS. 6 to 8 produces signal reflection along center via 25 as described above, which may reduce or eliminate signal insertion loss through the center via and/or may or eliminate reduce signal reflections along stripline conductor 32.

Figure 9:
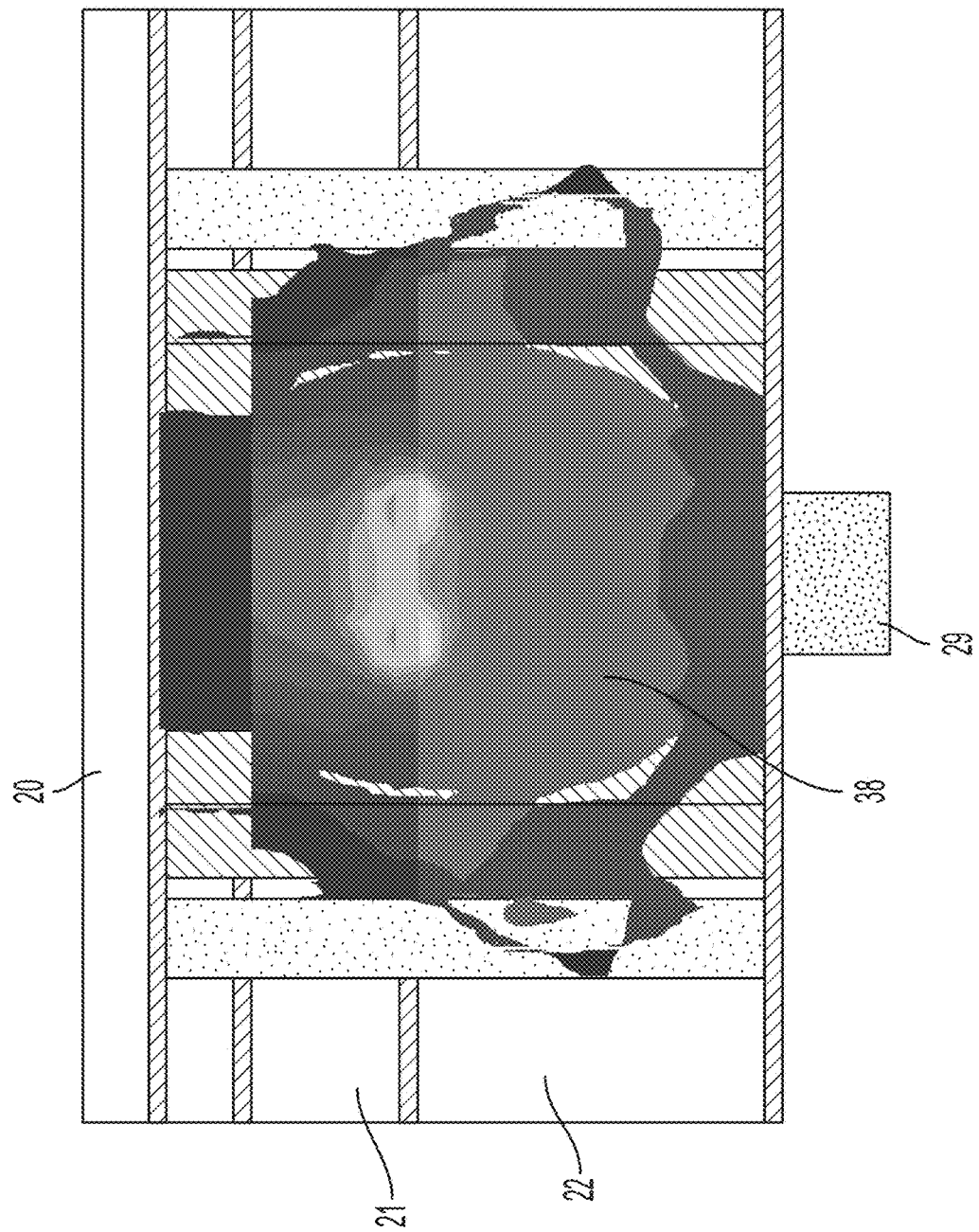
FIG. 9 is a front view of the components of the example transmission line of FIG. 6 showing energy dissipation therein.

The signal reflections along center via 25 are shown in FIG. 9 as greyscale shading 38. FIG. 9 shows that the reflected energy is confined to center via 25 and does not leak into surrounding substrate through drill-through 29. Explaining the reflections through center via 25 in another way, ground layer 34 creates a hard short-circuit to drill-through 29 at the quarter wavelength distance to form a resonator at a desired center frequency band. The resulting resonator is electrically connected to stripline conductor 32 by way of the electrical connection between center via 25 and stripline conductor 32. As a result of this configuration, drill-through 29 becomes just excess copper, no longer connected to any RF energy. Nevertheless, since drill-through 29 is now used to create an electrical ground connection to center via 25 to form the resonator, drill-through 29 has been transformed from a liability to an asset.

Referring to FIGS. 6 and 7, DIB 20 also includes a second ground layer 39, which may be made of any appropriate conductive material, such as copper. Ground layer 39 is connected to the reference ground voltage 36 as shown in FIG. 7. In this regard, both first ground layer 34 and second ground layer 39 are connected to the same reference ground voltage. Both ground layers are also unbroken on this example. Ground layer 39 is separated from stripline conductor 32 by substrate layer 21, as shown in FIG. 7. As shown in FIG. 6, hole 40 electrically isolates center via 25 from ground layer 39. Whereas first ground layer 34 provides shielding below the transmission line produced in substrate using stripline connector 32, second ground layer 38 provides shielding above the transmission line produced in substrate using stripline connector 32.

As shown in FIGS. 6 to 8, center via 25 is also surrounded, in part, by ground vias 42. Ground vias 42 may be columnar conductive vias that connect electrically to ground layer 34 and/or 39 and that extend along a length of center via 25—for example, the ground vias may be at least as long as center via 25. In this regard, ground layer 34 is connected to all grounding-vias and to drill-through 29. Ten ground vias 42 are shown in FIG. 6; however, any appropriate number of ground vias 42 may be used. As also shown, ground vias 42 encircle center via 25 partly. In this configuration, center via 25 and ground vias 42 together approximate the functionality of a coaxial conductor, with the center via 25 acting as a center conductor and the ground vias 42 acting as shielding or return. The center via, configured as a coaxial connection, allows mounting of an input coaxial transmission line to the DIB surface directly instead of bringing the connection in through a short segment of transmission line such as planar input 11 of FIG. 1. However, in some implementations, electrical connection to center via 25 may be made using a short segment of transmission line such as planar input 11 of FIG. 1. Furthermore, the radial ground vias 42 may improve impedance matching between center via 25 and stripline conductor 32 relative to configurations that do not include the radial ground vias. In this regard, the dimensions of center via 25 and stripline conductor 32 and the spacing and locations of ground vias 42 may all affect the impedance matching within the transmission line structure.

As shown, ground vias are absent at a point 45 of electrical connection between center via 25 and stripline conductor 32, making the preceding approximation imperfect. This is because stripline conductor 32 conducts the signals along its length and connecting a ground via directly to the stripline conductor would affect the signal transmission adversely. As a result of the "missing" ground vias, energy may leak from the approximated coaxial structure resulting in signal insertion loss.

To address the "missing" ground via(s) at the location of stripline conductor 32, an additional conductive trace (or simply "conductor" 46) is connected between center via 25 and stripline conductor 32. Conductor 46 may be made of copper or any other appropriate electrically conductive material. Conductor 46 is configured to create an electrical connection between center via 25 and stripline conductor 32. Conductor 46 is configured—for example, sized, shaped, and/or connected—to create an impedance match between stripline conductor 32 and center via 25. This impedance match addresses the impedance discontinuity explained previously and may reduce insertion loss and signal reflections along stripline conductor 32. In the example of FIG. 6, conductor 46 is a planar conductor having a width that is greater than a width of stripline conductor 32. However, the dimensions of conductor 46 may be different for differently-dimensioned stripline conductor/center via combinations. For example, conductor 46 may be a planar conductor having a width that is less than a width of stripline conductor 32. The width and the length of conductor 46 are based, at least in part, on the geometries of the other transmission line and DIB components. For example, different diameters of center via 25 and widths of stripline conductor 32 will require different geometries for conductor 46 to achieve impedance matching. Different types of dielectrics and dielectric thicknesses may also affect the dimensions of conductor 46.

DIB 20 also includes ground vias 50 that are conductive and that run substantially parallel to, and along each side of, stripline conductor 32 along at least part of—for example, all or less than all—a length of the stripline conductor 32. Ground vias 50 connect electrically to ground layers 34 and/or 39 and, thus, to the common reference voltage 36. Ground vias 50 provide electromagnetic shielding along sides of stripline conductor 32. As noted above, shielding above and below stripline conductor 32 is provided by ground layers 34 and 39. In some implementations, the ground vias are positioned far enough away from stripline conductor 32 to prevent signal shorting. The numbers and geometries of the ground vias may be dictated by factors such as the frequencies of the signals being transported and the geometries of other components of the transmission line, including the conductive and non-conductive parts. In some implementations the ground vias 50 that overlap ground vias 42 may be eliminated.

By virtue of the configurations of FIGS. 6 to 8, energy (for example, all energy) that would have leaked out of drill-through 29 is returned to the transmission line (stripline conductor 32). As a result, that energy is not lost through radiation and does not produce crosstalk in nearby transmission lines. Furthermore, in some examples, since the resonator λ/4 formed by the asymmetric PCB layer perfectly returns all center-frequency span energy to the transmission line, none of that energy is reflected back out the coaxial connector. Also, the impedance matching section implemented by additional conductor 46 may improve transmission line performance by improving both Insertion loss and return loss, in some examples by a relatively lesser amount.

Figure 10:
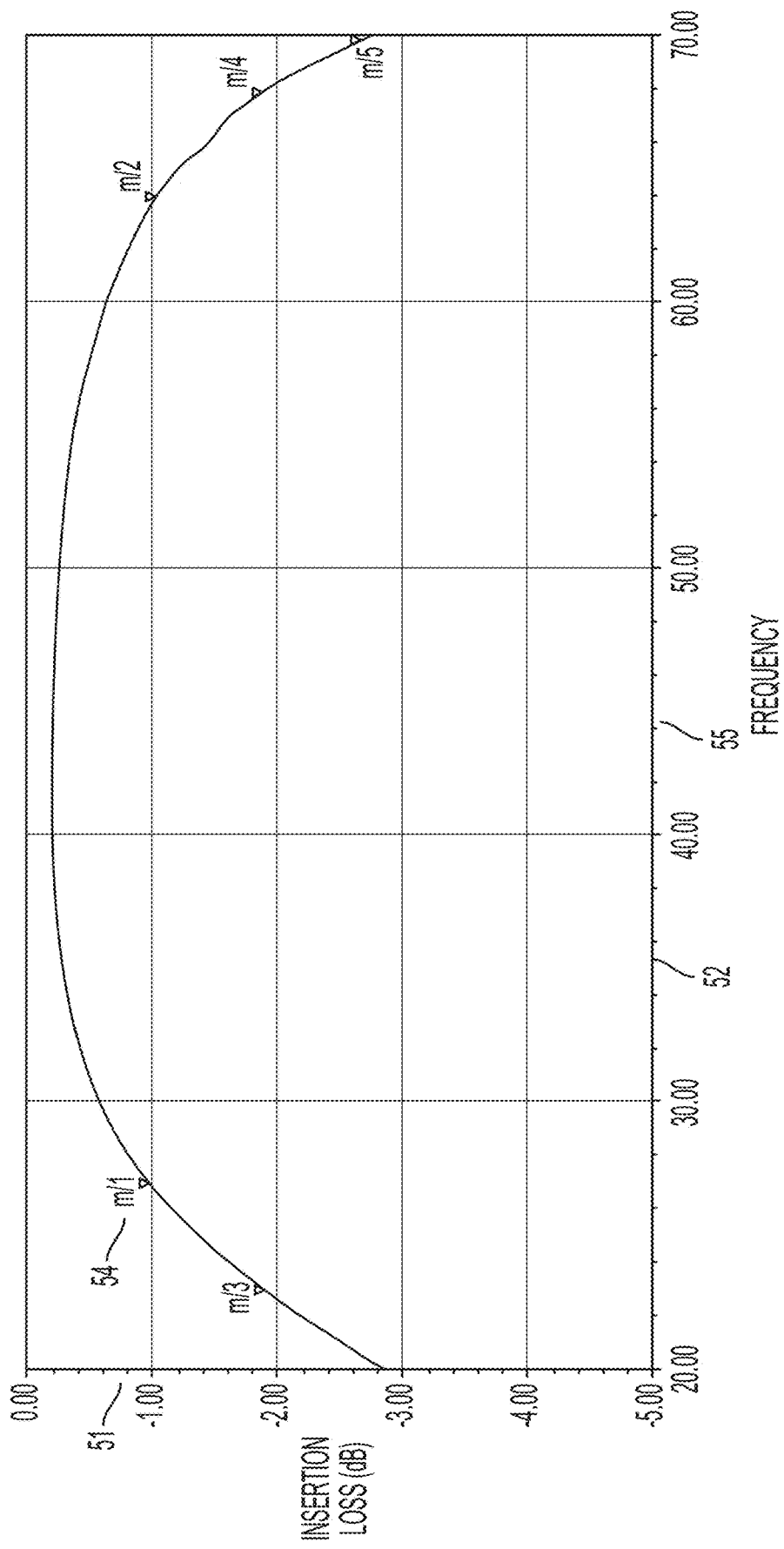
FIG. 10 is a plot showing insertion loss in decibels for an example transmission line of the type shown in FIG. 6 for a signal having a center frequency of 44 GHz (gigahertz).

FIG. 10 is a plot showing insertion loss 51 in decibels for an example system having a DIB of the type described with respect to FIGS. 6 to 8 and tuned to frequency 52 of 44 GHz 55. The insertion loss in this example is targeted to be less than 4 decibels (dB) for at least a 3 GHz band around the 44 GHz center frequency—that is, the center frequency span in this example. The markers, one of which is labeled 54, correspond a 1 dB loss of 37 GHz, leaving a margin for fabrication variation and a 3 dB Loss of 50 GHz, which makes this example system usable for multiple Federal Communications Commission (FCC) frequency bands.

Figure 11:
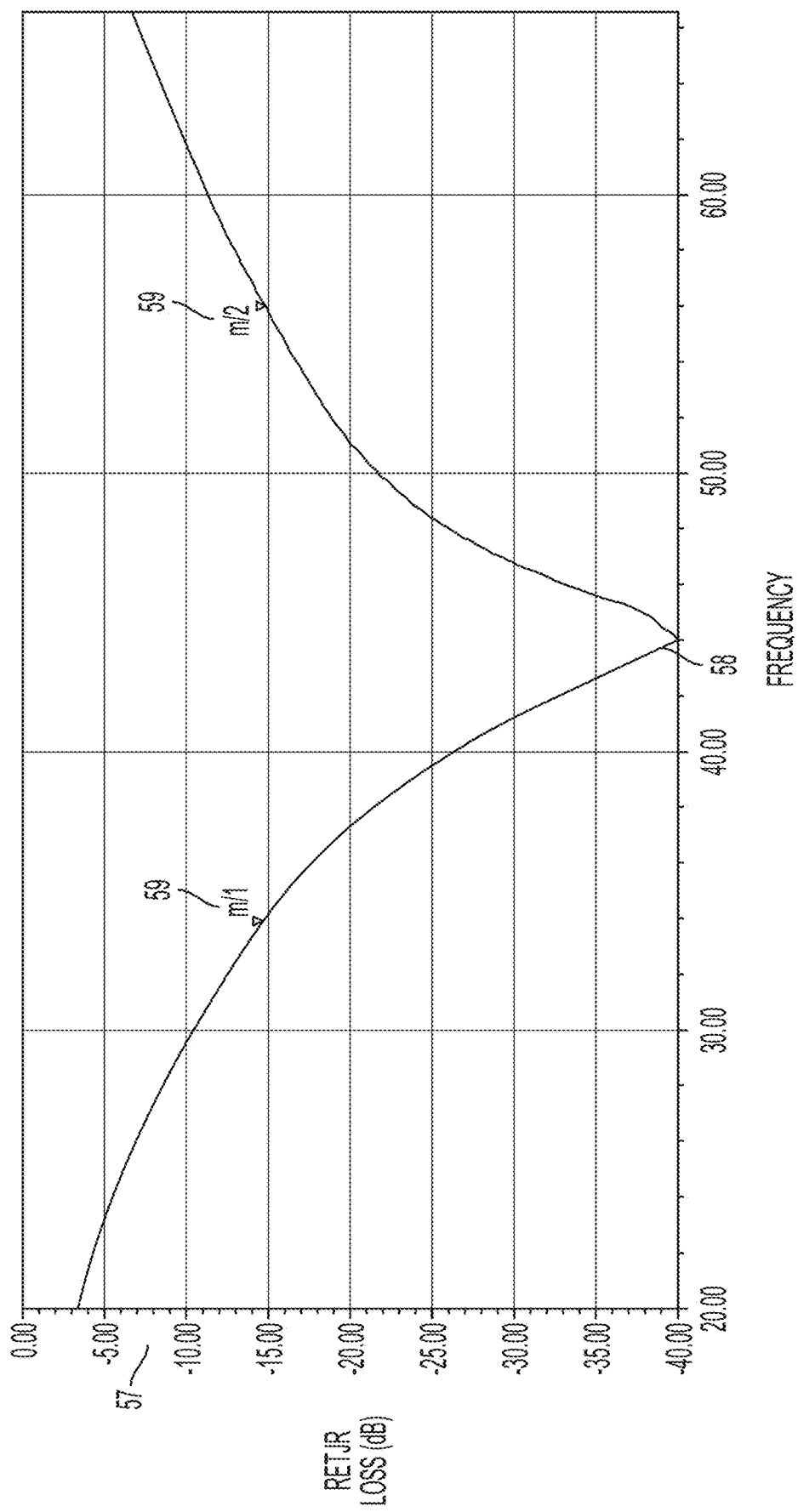
FIG. 11 is a plot is a plot showing signal return loss in decibels for an example transmission line of the type shown in FIG. 6 for a signal having a center frequency of 44 GHz.

FIG. 11 is a plot showing return loss 57 at 44 GHz 58 in the preceding system. In this example, the return loss is desired to be −15 dB or less. Generally, less return loss is better. Markers 59 are at −15 dB showing an acceptable performance span of 22 GHz.

The example transmission line structure described with respect to FIGS. 6 to 8 may be repeated multiple times on the same substrate, with all of ground layers connected to the same common reference voltage. The example transmission line structure thus includes multiple conductive traces like stripline conductor 32 that are between respective layers of dielectric material in the substrate and that are at least partly parallel to the respective layers of dielectric material. The example transmission line structure also includes multiple conductive vias like center via 25 that extend at least part-way through layers of dielectric material and that connect electrically to respective conductive traces and to respective signal inputs to receive or to source respective signals that have center frequency spans. The example transmission line structure also ground layers that connect electrically to respective ones of the conductive vias, with the ground layers defining a reference ground voltage, and with each the ground layers being located a distance from a respective conductive trace that is substantially equal to one quarter (¼) of a wavelength of a center frequency span of a signal received at a respective signal input. In some examples, the ground layer that forms the lower ground layer of a first transmission line (that connects to the drill-through) may connect directly to the ground layer that forms the upper ground layer for a second transmission line below the first transmission line in the substrate.

Figure 12:
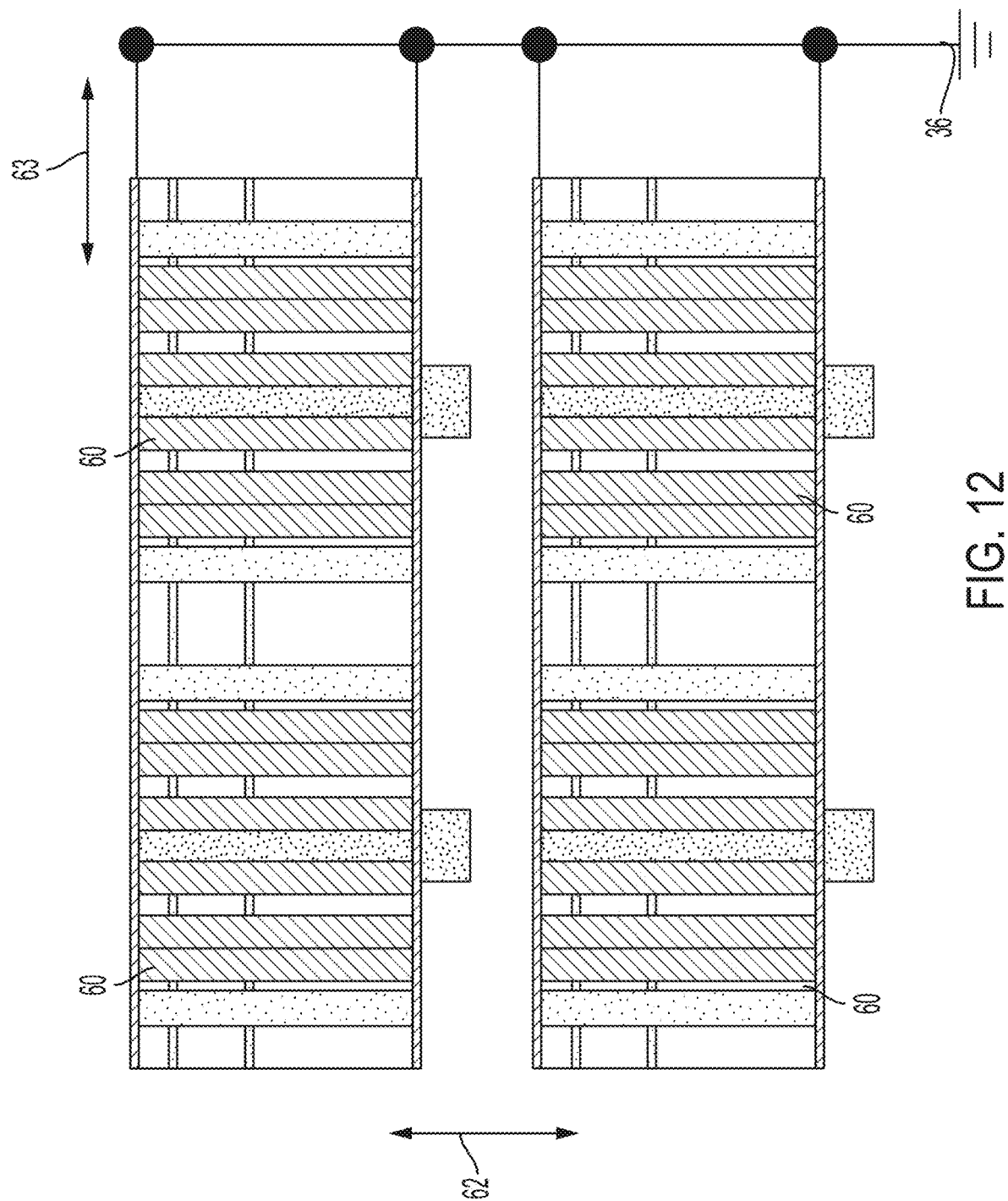
FIG. 12 is a front view of a matrix of transmission lines that may be included in an example DIB.

In this regard, as shown in FIG. 12, the transmission line structure 60 described with respect to FIGS. 6 to 8 may be stacked in the substrate along a dimension orthogonal to the layers of dielectric material, which dimension is represented by arrow 62. That is, multiple transmission lines may be formed along a thickness or depth of the substrate. As also shown in FIG. 12, the transmission line structure 60 described with respect to FIGS. 6 to 8 may repeated in the substrate in the dimension represented by arrow 63 (which is orthogonal to the dimension represented by arrow 62). Thus, multiple transmission lines may be located side-by-side in the same or nearly the same horizontal layers in the substrate. Stacked transmission lines may be repeated in the substrate resulting in a matrix of transmission lines throughout the same PCB as shown in FIG. 12. Although only four transmission lines are shown in FIG. 12, any appropriate number of transmission lines may be included. The transmission lines 60 in the matrix may run in in different directions and crisscross each other in different layers of the DIB. For example, transmissions on one layer of the PCB may be interleaved with other transmission lines on different layers. In an example matrix of transmission lines of this type, each transmission line has the structure of FIGS. 6 to 8 or one of its variants. Accordingly, for reasons described herein, interference among the signals in the matrix of transmission lines may be eliminated or reduced relative to transmission lines that have different structures. Each such transmission line may also have the other advantages, such as reductions in signal insertion loss and unwanted reflections.

In some implementations, a matrix of transmission lines like that shown in FIG. 12 may include one or more transmission lines having the configuration shown in FIGS. 1 to 3 in combination with one or more transmission lines having the configuration shown in FIGS. 6 to 8. For example, one or more transmission lines having the configuration shown in FIGS. 1 to 3 may be physically isolated in the matrix from other transmission lines to reduce the chances of energy dissipation affecting other transmission lines.

In some examples, signals that may be transported on the example DIBs and transmission lines described herein include, but are not limited to, signals at or above 20 KHz, signals at or above 100 KHz, signals at or above 1 GHz, signals at or above 10 GHz, signals at or above 20 GHz, signals at or above 30 GHz, signals at or above 40 GHz, signals at or above 50 GHz, signals at or above 60 GHz, signals at or above 70 GHz, signals at or above 80 GHz, signals at or above 90 GHz, signals at or above 100 GHz, signals at or above 200 GHz, or signals at or above 300 GHz, signals at or above 500 GHz, signals at or above 1000 GHz, and so forth.

Figure 13:
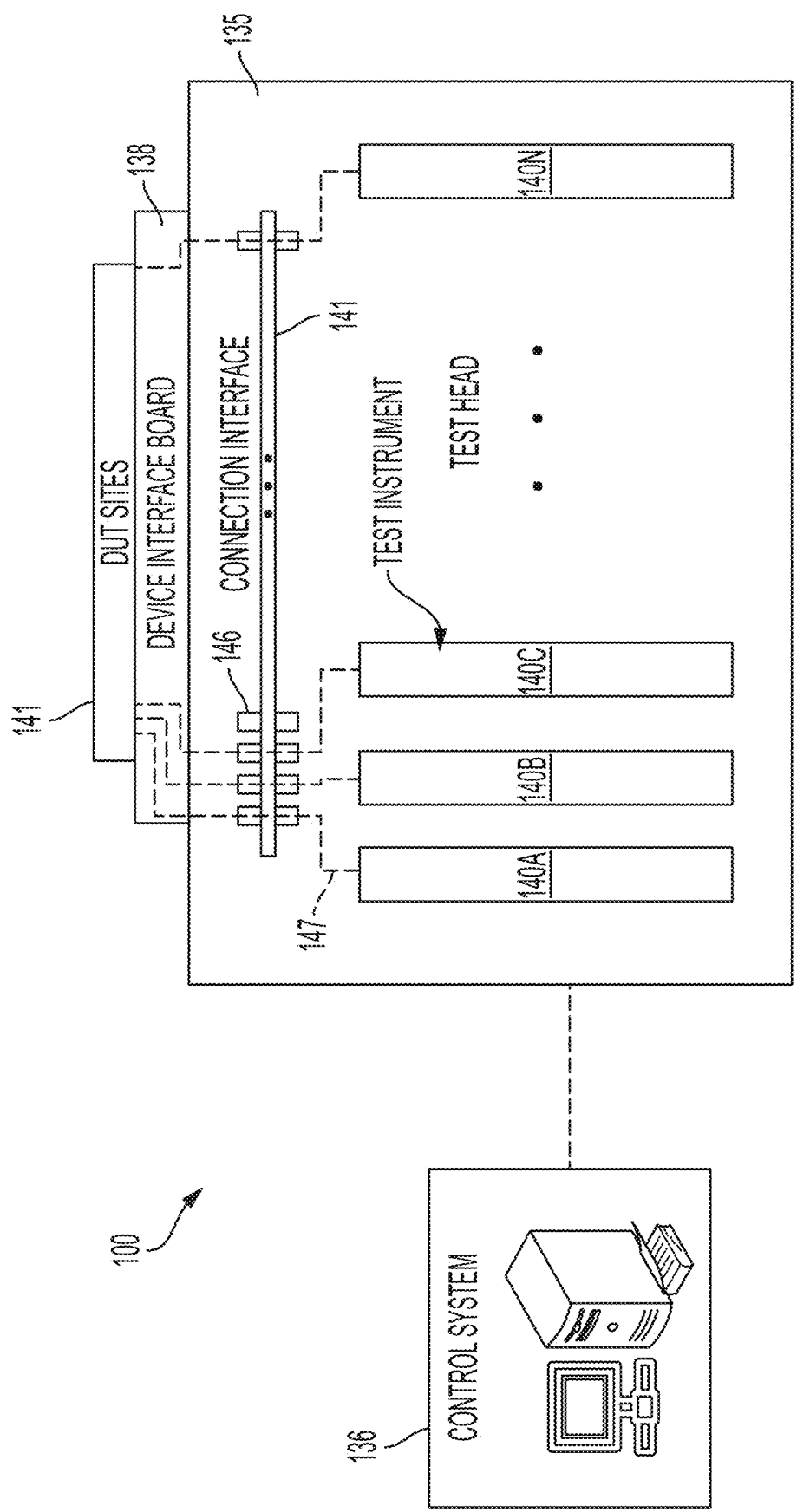
FIG. 13 is a block diagram of components of an example test system including instruments for sending digital signals to a device under test (DUT).

FIG. 13 shows components of ATE 100 that may include a DIB 138 of the type described herein. ATE 100 may be part of test system. In FIG. 13, the dashed lines represent, conceptually, potential signal paths between components of the test system.

ATE 100 includes a test head 135 and a control system 1361. The control system may include a computing system that includes one or more microprocessors or other appropriate processing devices as described herein.

DIB 138 is or includes a PCB that is connected to test head 135 and that includes mechanical and electrical interfaces to one or more DUTs that are being tested or are to be tested by the ATE. The DIB includes sites 141, which may include pins, ball grid arrays (BGAs), conductive traces, or other points of electrical and mechanical connection to which the DUTs may connect. Test signals, response signals, voltage signals, and other signals pass through test channels over the sites between the DUTs and test instruments. DIB 138 may also include, among other things, connectors, conductive traces, and circuitry for routing signals between the test instruments, DUTs connected to sites 141, and other circuitry. In this example, DIB 138 includes one or more connectors for connection to signal transmission lines or coaxial cables for transmitting signals between one or more test instruments and one or more DUTs. DIB 138 also includes one or more transmission lines having structures such as those described herein (e.g., the matrix of FIG. 12) to transmit signals through DIB-internal stripline conductors or other conductive traces to and/or from the DUTs.

Control system 136 communicates with components of the test head to control testing. For example, control system 136 may download test program sets to test instruments 140A to 140N in the test head. The test instruments include hardware devices that may include one or more processing devices and other circuitry. Test instruments 140A to 140N may run the test program sets to test DUTs in communication with the test instruments. Control system 136 may also send, to test instruments in the test head, instructions, test data, and/or other information that are usable by the test instruments to perform appropriate tests on DUTs interfaced to the DIB. In some implementations, this information may be sent via a computer or other type of network or via a direct electrical path. In some implementations, this information may be sent via a local area network (LAN) or a wide area network (WAN).

A test program generates a test flow to provide to the DUT. The test flow is written to output signals to elicit a response from the DUT, for example. The test flow may be written to output signals including RF signals, microwave signals, and/or mmwave signals to one or more DUTs, to receive responses to those signals from the DUTs, and to analyze the response to determine if a device passed or failed testing.

In the example of FIG. 13, ATE 100 includes multiple test instruments 140A to 140N, each of which may be configured, as appropriate, to perform one or more of testing and/or other functions. Although only four test instruments are depicted, the system may include any appropriate number of test instruments, including those residing outside of test head 135. In some implementations, one or more test instruments may be configured to output microwave, RF, or mmwave signals to test a DUT based, e.g., on data provided by the control system, and to receive response signals from the DUT. Different test instruments may be configured to perform different types of tests and/or be configured to test different DUTs. The received signals may include response signals that are based on the test signals and/or signals that originate from the DUT that are not prompted by (e.g., are not in response to) test signals. In some implementations, there may be coaxial cables and/or other signal transmission lines between the DUT, the DIB, and the test instrument interfaces over which test and response signals are sent.

Signals may be sent to, and received from, the DUT over multiple test channels. Each of these test channels may include one or more signal transmission lines, coaxial cable, or other wired or wireless transmission media. In some examples, a test channel may be defined by the physical transmission medium or media over which signals are sent from the test instrument to a DUT and over which signals are received from the DUT. In some examples, a test channel may be defined by a range of frequencies over which signals are transmitted over one or more physical transmission media. A test channel may include conductive trace(s) on the DIB.

In some examples, ATE 100 includes a connection interface 144 that connects test instrument test channels 147 to DIB 138. Connection interface 144 may include connectors 146 or other devices for routing signals between the test instruments and DIB 138. For example, the connection interface may include one or more circuit boards or other substrates on which such connectors are mounted. Conductors that are included in the test channels may be routed through the connection interface and the DIB.

All or part of the test systems and processes described in this specification and their various modifications may be configured or controlled at least in part by one or more computers such as control system 136 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the voltage source, the test system, and processes described herein can be performed by one or more programmable processors executing one or more computer programs to control all or some of the well formation operations described previously. All or part of the test systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

As used herein, "conductive" includes electrically conductive.

Other implementations not specifically described in this specification are also within the scope of the following claims.

What is claimed is:

1. A printed circuit board (PCB) comprising:
a substrate comprised of layers of dielectric material, the layers of dielectric material comprising a first layer and a second layer;
a conductive trace that is between the first layer and the second layer and that is parallel to the first layer and the second layer along at least part of a length of the conductive trace;
a conductive via that extends at least part-way through the layers of dielectric material and that connects electrically to the conductive trace, the conductive via being configured also to connect electrically to a signal input to receive a signal that has a center frequency span;
a first ground layer that connects electrically to the conductive via, the first ground layer connecting to a reference ground voltage, the first ground layer being adjacent to the second layer, and the first ground layer being located a distance from the conductive trace that is substantially equal to one quarter (¼) of a wavelength of the center frequency span of the signal; and
a second ground layer adjacent to the first ground layer and also connecting to the reference ground voltage, the conductive trace being between the first ground layer and the second ground layer.

2. The PCB of claim 1, wherein the conductive trace, the conductive via, the first ground layer, and the second ground layer form a first transmission line; and
wherein the first transmission line is interleaved with other transmission lines on different layers of the PCB.

3. The PCB of claim 1, wherein the conductive trace, the conductive via, the first ground layer, and the second ground layer form a first transmission line; and
wherein the first transmission is in a same layer of the substrate as one or more other transmission lines in the PCB.

4. The PCB of claim 1, further comprising;
conductive traces that are between respective layers of dielectric material in the substrate and that are at least partly parallel to respective layers of dielectric material;
conductive vias that extend at least part-way through the layers of dielectric material and that connect electrically to respective conductive traces, the conductive vias being configured also to connect electrically to respective signal inputs to receive respective signals that have center frequency spans; and
third ground layers that connect electrically to respective ones of the conductive vias, each third ground layer connecting to the reference ground voltage, each third ground layer being located a distance from a respective conductive trace that is substantially equal to one quarter (¼) of a wavelength of a center frequency span of a signal received at a respective signal input.

5. The PCB of claim 4, wherein the first ground layer, the second ground layer, and the third ground layers are unbroken.

6. The PCB of claim 4, wherein the first ground layer, the second ground layer, and the third ground layers are electrically connected to a common reference ground voltage.

7. The PCB of claim 1, wherein a structure having a configuration of the conductive trace, the conductive via, the first ground layer, and the second ground layer is repeated in the substrate along a same dimension of the PCB.

8. The PCB of claim 7, wherein the same dimension is horizontal.

9. The PCB of claim 1, wherein structures having a configuration of the conductive trace, the conductive via, the first ground layer, and the second ground layer are stacked in the substrate along a dimension orthogonal to the layers of dielectric material.

10. The PCB of claim 1, wherein the signal input comprises an input transmission line.

11. The PCB of claim 1, wherein the signal input comprises or a coaxial connector configured to connect directly to the conductive via.

12. The PCB of claim 1, wherein the signal input is also configured to source signals for output from the PCB.

13. The PCB of claim 1, wherein the PCB comprise a device interface board (DIB) configured to hold devices under test (DUTs) for testing; and
wherein the signal input electrically connects to a signal path between the DIB and a test instrument configured to generate the signal or to receive the signal.

14. The PCB of claim 1, wherein the first layer is comprised of one or more dielectric layers and the second layer is comprised of one or more dielectric layers;
wherein the first layer and the second layer are asymmetric in that the first layer and the second layer have different thicknesses; and wherein a thickness of the second layer is substantially equal to one quarter (¼) of a wavelength of the center frequency span of the signal.

15. The PCB of claim 1, further comprising:
ground vias that are conductive and that encircle the conductive via partly, the ground vias connecting electrically to the first ground layer.

16. The PCB of claim 15, wherein ground vias are absent at a point of electrical connection between the conductive trace and the conductive via.

17. The PCB of claim 1, further comprising:
a conductor configured to create an electrical connection between the conductive trace and the conductive via, the conductor to match an impedance of the conductive trace to an impedance of the conductive via.

18. The PCB of claim 17, wherein the conductor is between the first layer and the second layer and is parallel to the first layer and the second layer along at least part of a length of the conductor.

19. The PCB of claim 18, wherein the conductive trace comprises a stripline conductor; and
wherein the conductor has a width that differs from a width of the conductive trace.

20. The PCB of claim 1, further comprising:
ground vias that are conductive and that run substantially parallel to the conductive trace along at least part of a length of the conductive trace, the ground vias connecting electrically to the first ground layer.

21. The PCB of claim 1, wherein the first ground layer reflects at least the center frequency span of the signal along the conductive via and a resulting reflected signal launches into the conductive trace.

22. The PCB of claim 1, wherein the signal comprises a radio frequency signal.

23. The PCB of claim 1, wherein the signal comprises a microwave signal.

24. The PCB of claim 1, wherein the signal comprises a millimeter wave signal.

25. The PCB of claim 1, wherein the first layer and the second layer comprise different dielectrics.

26. The PCB of claim 25, wherein the different dielectrics have at least one of different dispersion characteristics or different insertion losses.

27. The PCB of claim 25, wherein the different dielectrics have different chemical properties such that, from a perspective of the signal, the first layer and the second layer have a same electromagnetic thickness even though the first and second layers have different physical thicknesses.

28. The PCB of claim 1, wherein the signal comprises a sinusoidal signal.

29. The PCB of claim 1, wherein the signal comprises a modulated signal.

30. The PCB of claim 1, wherein the signal is one of multiple signals that move bidirectionally through the conductive trace.

31. The PCB of claim 30, wherein the multiple signals comprise two signals that are separated by a difference of frequency and that share a common overall bandwidth.

32. A system comprising:
a device interface board (DIB) configured to hold devices under test (DUTs) for testing;
a test instrument configured to output signals to test the DUTs, the DIB for routing the signals to the DUTS; and
a control system comprising at least one processing device configured to control operation of the test instrument to output the signals to test the DUTs;
wherein the DIB comprises:
a substrate comprised of layers of dielectric material, the layers of dielectric material comprising a first layer and a second layer;
a conductive trace that is between the first layer and the second layer and that is parallel to the first layer and the second layer along at least part of a length of the conductive trace;
a conductive via that extends at least part-way through the layers of dielectric material and that connects electrically to the conductive trace, the conductive via being configured also to connect electrically to a signal input to receive a signal that has a center frequency span;
a first ground layer that connects electrically to the conductive via, the first ground layer connecting to a reference ground voltage, the first ground layer being adjacent to the second layer, and the first ground layer being located a distance from the conductive trace that is substantially equal to one quarter (¼) of a wavelength of the center frequency span of the signal; and
a second ground layer adjacent to the first ground layer and connecting to the reference ground voltage, the conductive trace being between the first ground layer and the second ground layer.

33. The system of claim 32, wherein the first layer is comprised of one or more dielectric layers and the second layer is comprised of one or more dielectric layers;
wherein the first layer and the second layer are asymmetric in that the first layer and the second layer have different thicknesses; and
wherein a thickness of the second layer is substantially equal to one quarter (¼) of a wavelength of the center frequency span of the signal.

34. The system of claim 32, wherein the DIB further comprises:
ground vias that are conductive and that encircle the conductive via partly, the ground vias connecting electrically to the first ground layer.

35. The system of claim 32, wherein the DIB further comprises:
a conductor configured to create an electrical connection between the conductive trace and the conductive via, the conductor to match an impedance of the conductive trace to an impedance of the conductive via.

36. The system of claim 32, wherein a structure having a configuration of the conductive trace, the conductive via, the first ground layer, and the second ground layer is repeated in the substrate.

37. The system of claim 32, wherein structures having a configuration of the conductive trace, the conductive via, the first ground layer, and the second ground layer are stacked in the substrate along a dimension orthogonal to the layers of dielectric material.

38. A device interface board (DIB) configured to act as a mechanical and electrical interface between a device under test (DUT) and a test instrument of a test system, the DIB comprising:
a substrate comprised of layers of dielectric material, the layers of dielectric material comprising a first layer and a second layer;
a conductive trace that is between the first layer and the second layer and that is parallel to the first layer and the second layer along at least part of a length of the conductive trace;
a conductive via that extends through the layers of dielectric material and that connects electrically to the conductive trace, the conductive via being configured also to connect electrically to a signal input to receive a signal having a center frequency span;

a ground layer to cause the signal to reflect along the conductive via, the ground layer also to inhibit dissipation of at least part of the signal into the substrate; and a conductor to create an electrical connection between the conductive trace and the conductive via, the conductor to match an impedance of the conductive trace to the conductive via to inhibit signal reflection along the conductive trace.

* * * * *